United States Patent
Khotimsky (10) Patent No.: US 10,044,467 B2
(45) Date of Patent: Aug. 7, 2018

(54) METHOD AND APPARATUS OF DOWNSTREAM FORWARD ERROR CORRECTION ON-OFF CONTROL IN XG-PON1 AND NG-PON2 TWDM-PON SYSTEMS

(71) Applicant: ZTE (USA) INC., Iselin, NJ (US)

(72) Inventor: Denis A. Khotimsky, Westborough, MA (US)

(73) Assignee: ZTE (USA) INC., Iselin, NJ (US)

(*) Notice: Subject to any disclaimer, the term of this patent is extended or adjusted under 35 U.S.C. 154(b) by 0 days.

(21) Appl. No.: 14/767,838

(22) PCT Filed: Feb. 25, 2014

(86) PCT No.: PCT/US2014/018352
§ 371 (c)(1),
(2) Date: Aug. 13, 2015

(87) PCT Pub. No.: WO2014/131018
PCT Pub. Date: Aug. 28, 2014

(65) Prior Publication Data
US 2015/0381313 A1   Dec. 31, 2015

Related U.S. Application Data

(60) Provisional application No. 61/769,057, filed on Feb. 25, 2013.

(51) Int. Cl.
*H04L 1/00* (2006.01)
*H03M 13/05* (2006.01)
(Continued)

(52) U.S. Cl.
CPC .......... *H04L 1/0041* (2013.01); *H03M 13/05* (2013.01); *H03M 13/1515* (2013.01);
(Continued)

(58) Field of Classification Search
CPC .... H04L 1/0041; H04L 1/0045; H03M 13/05; H03M 13/1515; H03M 13/35; H03M 13/6356
See application file for complete search history.

(56) References Cited

U.S. PATENT DOCUMENTS 9,088,310 B2 * 7/2015 Nielsen
9,178,713 B1 * 11/2015 Johnston ............... H04L 7/0075
(Continued)

FOREIGN PATENT DOCUMENTS

CN   101795174   8/2010
EP   0993158 A1   4/2000

OTHER PUBLICATIONS

Official Action dated May 11, 2017, in corresponding Chinese Patent Application No. 201480010191.8.
(Continued)

*Primary Examiner* — Kyle Vallecillo
(74) *Attorney, Agent, or Firm* — Duane Morris LLP (57) ABSTRACT

An apparatus and method for receiving and transmitting data is disclosed. In one exemplary embodiment, the method includes: controlling a data source output source frames at a first data rate; receiving a source frame at an encoder at the first data rate; reading a fixed number of n-byte data blocks from the source frame, wherein n is an integer; appending an (m-n)-byte parity block to each n-byte data block to form the fixed number of m-byte first code words, wherein m is an integer greater than n; prepending to the fixed number of m-byte first code words a first prefix to form an error correcting physical frame, the first prefix including an error correction indicator set to a first value and an extra data indicator set to a second value; and transmitting the error correcting physical frame at a fixed transmit data rate.

19 Claims, 9 Drawing Sheets

(51) Int. Cl.
*H03M 13/15* (2006.01)
*H03M 13/35* (2006.01)
*H03M 13/00* (2006.01)

(52) U.S. Cl.
CPC ....... *H03M 13/35* (2013.01); *H03M 13/6356* (2013.01); *H04L 1/0045* (2013.01)

(56) References Cited

U.S. PATENT DOCUMENTS

| | | | |
|---|---|---|---|
| 2002/0122395 A1* | 9/2002 | Bourlas | H04L 47/14 370/329 |
| 2004/0208631 A1 | 10/2004 | Song et al. | |
| 2008/0242236 A1 | 10/2008 | Spencer | |
| 2010/0232550 A1 | 9/2010 | Lee et al. | |
| 2011/0142437 A1 | 6/2011 | Luo et al. | |
| 2012/0320994 A1 | 12/2012 | Loghin et al. | |
| 2013/0004179 A1* | 1/2013 | Nielsen | H04B 3/50 398/115 |
| 2014/0161456 A1* | 6/2014 | Sugawa | H04J 14/0227 398/72 |

OTHER PUBLICATIONS

International Search Report/Written Opinion dated Jun. 23, 2014, in corresponding International Application No. PCT/US2014/018352.

* cited by examiner

METHOD AND APPARATUS OF DOWNSTREAM FORWARD ERROR CORRECTION ON-OFF CONTROL IN XG-PON1 AND NG-PON2 TWDM-PON SYSTEMS

CROSS-REFERENCE TO RELATED APPLICATIONS

This application is a 35 U.S.C. § 371 U.S. National Phase Application of PCT/US2014/018352, filed on Feb. 25, 2014, which claims the benefit of priority under 35 U.S.C. § 119(e) to U.S. Provisional Application No. 61/769,057, titled "Method And Apparatus of Downstream Forward Error Correction On-Off Control in XG-PON1 and NG-PON2 TWDM-PON Systems," filed Feb. 25, 2013, which is incorporated by reference herein in its entirety.

BACKGROUND

This application relates to systems, devices, and techniques that implement data communications in single-wavelength-channel and multiple-wavelength-channel passive optical network systems.

A passive optical network (PON) is an optical network architecture based on point-to-multipoint (P2MP) topology in which a single optical fiber and multiple passive branching points are used to provide data communication services. A PON system can facilitate user access with a service provider communication facility to access telecommunication, information, entertainment, and other resources of the Internet. A PON system can include a central node, called an optical line terminal (OLT), which can be in connection with a single or multiple user nodes called optical network units (ONUs) via a passive optical distribution network (ODN). An ONU can be located at or near the access user's premises. An OLT can be located at the access provider's communication facility (central office). In a conventional PON system based on the time-division multiplexing/time-division multiple access (TDM/TDMA) principles, such as G.984 G-PON or G.987 XG-PON, the OLT operates on a single downstream wavelength and a single upstream wavelength. The plurality of the ONUs connected to the OLT over the ODN share the same downstream and same upstream wavelength.

A G.987 XG-PON system operating at the line rates of 9.95328 Gb/s downstream and 2.48832 Gb/s upstream has a designation of XG-PON1. A G.987 XG-PON system operating at the symmetric line rates of 9.95328 Gb/s downstream and upstream has a designation of XG-PON2. The nominal shorthand notation for 9.95328 Gb/s is 10 G, and the nominal shorthand notation for 2.48832 Gb/s is 2.5 G.

In a multi-wavelength passive optical network (MW-PON), multiple OLTs each operating on a unique downstream wavelength and unique upstream wavelength are connected to one and the same ODN via a wavelength multiplexor (WM), and over the said ODN are connected to a plurality of ONUs. A combination of one downstream wavelength and one upstream wavelength associated with a given OLT forms a bi-directional wavelength channel. Multiple downstream wavelengths reach each ONU; however, each ONU is capable of receiving and processing only one downstream wavelength and generating only one upstream wavelength at any given time. An ONU may be designed to operate on a specific pair of downstream and upstream wavelengths, in which case it is a fixed ONU, or it may be capable of changing its downstream and upstream wavelength in time, in which case it is tunable ONU.

The multi-wavelength TWMD-PON systems are standardized within the framework of the ITU-T G.989 series of Recommendations. The G.989 systems are supposed to support the following combinations of downstream and upstream line rates per each bi-directional wavelength channel:

10 G downstream and 10 G upstream
10 G downstream and 2.5 G upstream
2.5 G downstream and 2.5 G upstream The TWDM-PON channel specifications for the line rate combinations involving the downstream line rate of 10 G are supposed to be derived based on G.987 XG-PON specification.

An ODN is characterized by the maximum fiber distance, that is, the overall length of fiber between the OLT and the remotest of the ONUs, and the maximum split ratio, that is, the smallest fraction of the optical power transmitted by the OLT (assuming no attenuation) that reaches an ONU due to the branching devices encountered in the ODN. The overall attenuation of an ODN, which depends of both the maximum fiber distance and the maximum split ratio, determines the loss budget of the ODN. For a passive optical system to operate correctly, the ODN loss budget should be balanced with the OLT and ONU transceiver optical power budget, which can be determined as a difference between the worst-case mean optical launch power of the transmitter and the worst-case receiver sensitivity, a parameter characterizing the minimum value of the received optical power at that the receiver is able operate. The receiver's ability to operate is usually quantified in terms of bit-error rate (BER) of received digital signal: generally, the weaker the received optical signal in its critical region, the higher the BER of the received digital signal. Therefore, the receiver sensitivity is not to be measured in the absolute terms, but rather with respect to a specified reference BER level. Normally, the reference BER level is set at between $10^{-10}$ and $10^{-12}$.

Forward Error Correction (FEC) is a well-known technique to improve the reliability of the data communication over an unreliable medium. It has been widely employed in data transmission and storage systems. In essence, to implement FEC, the source of data (that is, a transmitter in digital data communication, or a writer in digital data storage) adds redundancy to the data that is transmitted or stored. When the data is recovered by a receiver on a communication link, or by a reader of the storage device, the redundancy allows the decoder to detect and restore some of the data that may have been corrupted in the course of transmission or storage. The number of errors subject to successful restoration can be quantified and depend on the amount of redundancy added by the data source.

FEC in passive optical networks improves the BER of the received digital signal and, therefore, allows the use of less sensitive (and hence less expensive) receivers to balance the loss budget of a given ODN. Alternatively, FEC can be viewed as a tool to improve the optical power budget of the OLT and ONU transceiver pair. The use of FEC, however, comes at a cost of increased transmission overhead in the form of the digital bandwidth that is required to transmit the redundant information over the optical communication link.

In G.987 XG-PON1 systems operating at the line rates of 10 G downstream and 2.5 G upstream, the ONU receiver sensitivity is specified at the high reference level of $BER=10^{-3}$, implying the use of FEC to reduce the effective BER to the required level of $10^{-12}$ after FEC is applied. Such BER reduction is possible if a high-redundancy FEC code is used. For such a high-redundancy FEC code, the ITU-T Recommendation G.987.3 specifies the Reed-Solomon code RS(248,216) which is a shortened form of the popular RS(255,223) code. The use of the shortened (or truncated) form of the code allows alignment of the size of the code word on the width of the system data path and to simplify the design of the system. An RS(248,216) code belongs to the family of systematic linear cyclic block codes. For each 216 symbols (bytes) of the useful data, it adds 32 bytes of redundant information (parity bytes).

Since in the downstream direction the FEC applies to all ONUs on the system, to account for the worst case ODN loss, ITU-T G.987 Recommendation series specifies the downstream FEC as always on. According to G.987.3, clause 10.3, "FEC support is mandatory for both OLT and ONU in the upstream as well as downstream directions. In the downstream direction, FEC is always on; in the upstream direction, the use of FEC is under dynamic control by the OLT."

Since in the downstream direction the FEC applies to all ONUs on the system, to account for the worst case ODN loss, ITU-T G.987 Recommendation series specifies the downstream FEC as always on. According to G.987.3, clause 10.3, "FEC support is mandatory for both OLT and ONU in the upstream as well as downstream directions. In the downstream direction, FEC is always on; in the upstream direction, the use of FEC is under dynamic control by the OLT."

An XG-PON1 system operates at the downstream line rate of 9.95328 Gb/s, transmitting a PHY frame of the size of 155520 bytes every 125 microseconds. A PHY frame consists of a 24 byte Physical Synchronization Block (PSBd) and sequence of 627 RS(248,216) code words, each code word being 248 bytes long. Therefore, the effective capacity of the XG-PON1 downstream link after FEC is 8.667648 Gb/s, or approximately 87.1% of the line rate. At the time when the XG-PON systems were standardized (2010), this effective capacity was considered sufficient for the envisioned applications. However, the newly emerging applications of XG-PON1 and, especially, of NG-PON2 TWDM-PON systems based on XG-PON1 may require low split ratio, but highest possible capacity. With low required split ratio, such applications do not operate under the worst case ODN losses, and, therefore, improving the power budget is no longer a priority. In such situations, incurring the FEC overhead may become an unnecessary burden. However, the always-on restriction and the lack of the downstream FEC ON-OFF control in XG-PON1 make that overhead unavoidable.

A known problem with dynamic FEC control is that turning FEC on and off involves processes that execute with different speed: multiplexing the FEC parity bytes onto the outgoing data stream or removing the parity bytes from the outgoing data stream can be achieved in effect instantaneously (a single PHY frame timescale). However, adjusting the rate of the datapath may require flow-control operations with extended feedback loops, and is relatively slow. For example, in the case of XG-PON1, the XGTC framing datapath (which is the next higher sublayer of the XG-PON protocol stack) handles data at the rate of 135432 byte per frame. Should it be possible to support FEC ON-OFF control, and disable FEC starting at a given PHY frame, the XGTC data path would have to transition to handling data at the rate of 155496 bytes per frame.

Such process speed discrepancy has led to the recognition that FEC ON-OFF adjustment may not be a lossless operation. Thus ITU-T Recommendation G.984.3 "G-PON TC layer specification", which supports downstream FEC ON-OFF control and uses a single bit FEC indication emphasizes (G.984.3(2008), clause 13.2.3.1): "Note that the activation and deactivation of FEC is not meant to be an 'in-service' operation. The behavior during switch-over is undefined, and likely to cause a momentary loss of data."

SUMMARY

In one aspect, embodiments of the present disclosure provide methods of transmitting data. In one embodiment, the method controls a data source to output source frames at a first data rate. The method receives a source frame at an encoder at a first input data rate. The method reads a fixed number of n-byte data blocks from the source frame. The method appends an (m-n)-byte parity block to each n-byte data block to form the fixed number of m-byte first code words. The method prepends to the fixed number of m-byte first code words a first prefix to form an error correcting physical frame. The first prefix includes an error correction indicator set to a first value and an extra data indicator set to a second value. The method transmits the error correcting physical frame at a fixed transmit data rate.

The method controls the data source to increase the data rate of the source frames. The method receives a source frame at the encoder at the increased input data rate. The method reads the fixed number of n-byte data blocks from the source frame received at the increase input data rate. The method appends an (m-n)-byte padding block to each n-byte data block from the source frame received at the increased input data rate to form the fixed number of m-byte second code words. The method prepends to the fixed number of m-byte second code words a second prefix to form an padded physical frame, the second prefix including the error correction indicator set to the second value and the extra data indicator set to the second value. The method transmits the padded physical frame at the fixed transmit data rate.

The method detects when the output data rate of source frames equal to a second data rate, which is higher than the first data rate. The method receives a source frame at the encoder at the second input data rate. The method reads the fixed number of m-byte data blocks from the source frame received at the second input data rate. The method prepends to the fixed number of m-byte data blocks from the source frame received at the second input data rate a third prefix to form an extra data physical frame, the third prefix including the error correction indicator set to the second value and the extra data indicator set to the first value. The method transmits the extra data physical frame at the fixed transmit data rate.

In another aspect, embodiments of the present disclosure provide methods of receiving data. In one embodiment, the method receives a physical frame at a decoder. The physical frame includes a fixed number of m-byte code words and a prefix. The prefix includes an error correction indicator and an extra data indicator. If the error correction indicator is set to a first value and the extra data indicator is set to a second value, the method operates the decoder to perform error correction on each code word of the physical frame to output n-byte data blocks, wherein n is an integer less than m. If the error correction indicator is set to the second value and the extra data indicator is set to the second value, the method operates the decoder to discard an (m-n)-byte padding block from each code word of the physical frame to output n-byte data blocks. If the error correction indicator is set to the second value and the extra data indicator is set to the first value, the method operates the decoder to output each code word of the physical frame as an m-byte data block.

In another aspect, embodiments of the present disclosure provide data transmitters. In one embodiment, the transmitter includes a data source and an encoder. The encoder includes an m-byte input data section. The input data section includes an n-byte first part, coupled to receive n-byte data blocks from the data source, and an (m-n)-byte second part, coupled to receive (m-n)-byte extra data blocks from the data source. A parity calculator is coupled to receive n-byte data blocks from the first part of the input data section and calculate (m-n)-byte parity blocks. A delay section is coupled to receive the n-byte data blocks from the first part of the input data section. The encoder includes a padding byte source. A first selector is coupled to receive padding bytes from the padding byte source and extra data blocks from the second part of the data input section. The first selector is operable to selectively output padding bytes or extra data blocks. A second selector is coupled to the first selector and the parity calculator. The second selector operable to selectively output the output of the first selector or parity blocks. A code word section coupled to the second selector and the delay section. An encoder controller is operable to control the data source to supply to the encoder n-byte data blocks, if an extra data indicator is set to a first value, and m-byte data blocks, if the extra data indicator is set to a second value. The controller is operable to control the first selector to output to the second selector extra data blocks, if the extra data indicator is set to the first value, and padding blocks, if the extra data indicator is set to the second value. The controller is operable to control the second selector to output to the code word section parity blocks from the parity calculator, if an error correction indicator is set to the first value, and the output of the first selector, if the error correction indicator is set to the second value.

In another aspect embodiments of the present disclosure provide data receivers. In one embodiment, the receiver includes a physical frame source coupled to receive fixed size physical frames. Each physical frame includes a prefix and a plurality of m-byte code words. Each prefix includes an extra data indicator and an error correction indicator. The receiver includes a decoder coupled to receive physical frames from the physical frame source. The decoder includes an input data section coupled to sequentially receive m-byte code words from the physical frame source. The input data section includes a first part receiving n-byte data blocks and a second part receiving (m-n)-byte second blocks. A first gate is coupled to receive second blocks from the second part of the input data section. An error correction decoder is coupled to receive second blocks from the second part of the input data section and data blocks from the first part of the input data section. The decoder includes a second gate coupled to receive coupled to receive output from the error correction decoder. A random access memory (RAM) is coupled to receive data blocks from the first part of the input data section and output from the second gate. An m-byte output data section is coupled to receive n-byte data blocks from the RAM and to receive (m-n)-byte extra data from the first gate. The decoder includes a decoder controller operable to read the prefix of a physical frame received from the physical frame source to determine settings for the extra data indicator and the error correction indicator. The controller is operable to open the first gate if the extra data indicator is set to a first value and close the first gate if the extra data indicator is set to a second value. The controller is operable to open the second gate if the error correction indicator is set to the first value and close the second gate if the error correction indicator is set the second value.

BRIEF DESCRIPTION OF THE DRAWINGS

Aspects of the present disclosure are best understood from the following detailed description when read with the accompanying figures. It is emphasized that, in accordance with the standard practice in the industry, various features are not drawn to scale. In fact, the dimensions of the various features can be arbitrarily increased or reduced for clarity of discussion.

FIG. 4 is a pictorial representation illustrating an embodiment of forming a PHY frame in XG-PON1 with FEC OFF and XD ON.

DETAILED DESCRIPTION

This description is intended to be read in connection with the accompanying drawings, which are to be considered part of the entire written description. In the description, relative terms such as "lower," "upper," "horizontal," "vertical,", "above," "below," "up," "down," "top" and "bottom" as well as derivatives thereof (e.g., "horizontally," "downwardly," "upwardly," etc.) should be construed to refer to the orientation as then described or as shown in the drawing under discussion. These relative terms are for convenience of description and do not require that the apparatus be constructed or operated in a particular orientation. Terms concerning coupling and the like, such as "connected" and "interconnected," refer to a relationship wherein devices or nodes are in direct or indirect electrical communication, unless expressly described otherwise.

It is understood that the following disclosure provides many different embodiments or examples for implementing different features of various embodiments. Specific examples of components and arrangements are described below to simplify the present disclosure. These are, of course, merely examples and are not intended to be limiting. The present disclosure may repeat reference numerals and/or letters in the various examples. This repetition is for the purpose of simplicity and clarity and does not in itself dictate a relationship between the various embodiments and/or configurations discussed.

Figure 1:
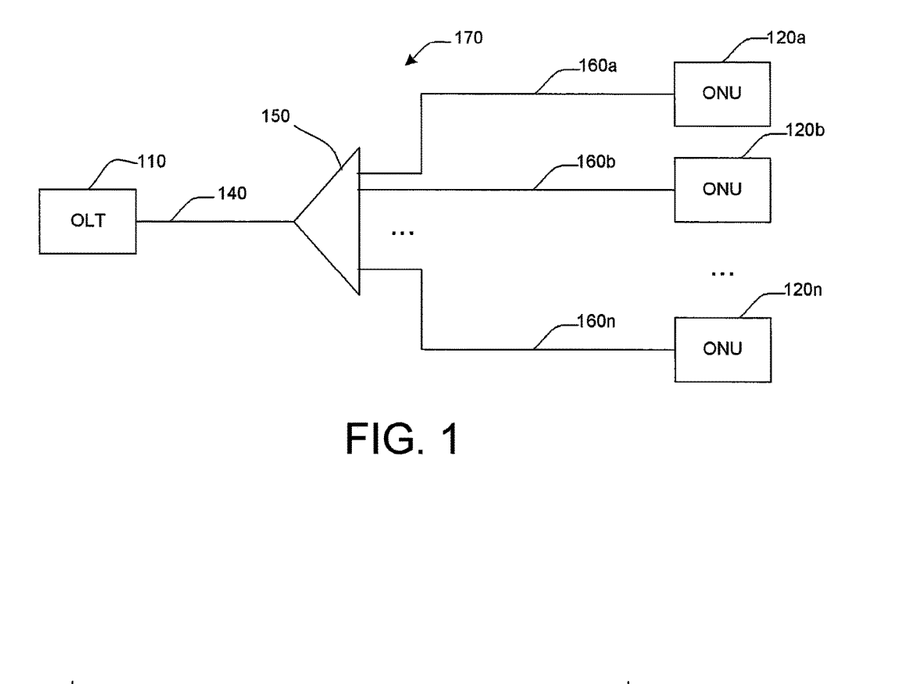
FIG. 1 is a block diagram of an embodiment of a single-channel TDM PON system.

Referring to FIG. 1, a conventional TDM/TDMA PON system includes a single OLT 110 and a plurality of ONUs 120 interconnected by an optical distribution network (ODN) 170 that includes optical feeder fiber or trunk fiber 140, splitter 150, and multiple distribution fibers 160. Such PON systems support a single bi-directional wavelength channel offering unique downstream and unique upstream line rates. All ONUs 120 support fixed downstream and upstream wavelengths and a fixed combination of downstream and upstream line rates.

Forward error correction belongs to the PHY adaptation sublayer of the XG-PON1 protocol stack, which provides service to the XGTC framing sublayer with the goal to form a bit stream improving the detection, reception and delineation properties of the signal transmitted over the optical medium.

Figure 2:
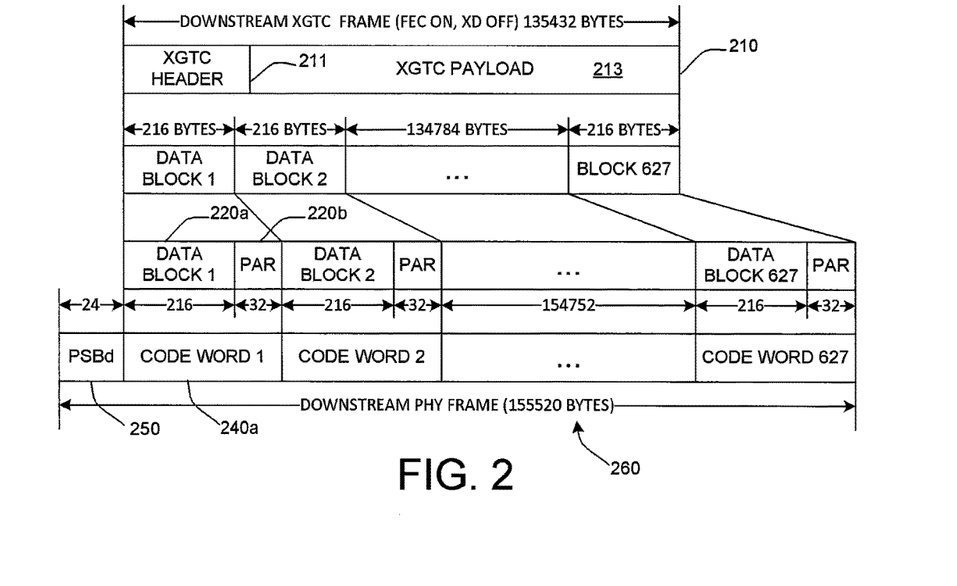
FIG. 2 is a pictorial representation illustrating an embodiment of parity byte insertion and forming in a PHY frame in XG-PON1 with FEC ON and XD OFF.

Referring to FIG. 2, the XGTC framing sublayer supplies the PHY adaptation sublayer with service data unit in the form of an XGTC frame 210, which includes an XGTC header 211 and an XGTC payload 213, and which has a fixed length of 135432 bytes. In the PHY adaptation sublayer, XGTC frame 210 is partitioned into 627 data blocks 220, each of which contain 216 bytes. To each data block 220 a parity block 230 is added by FEC encoder (to be described in detail hereinafter) to form a 248-byte-long code word 240. Parity block 230 is 32 bytes long. Finally, a downstream physical synchronization block (PSBd) 250 is prepended to each series of 627 code words 240 to form a PHY frame 260. The PSBd is 24 bytes long. Accordingly, the overall size of the PHY frame 260 is 155520 bytes.

Figure 3:
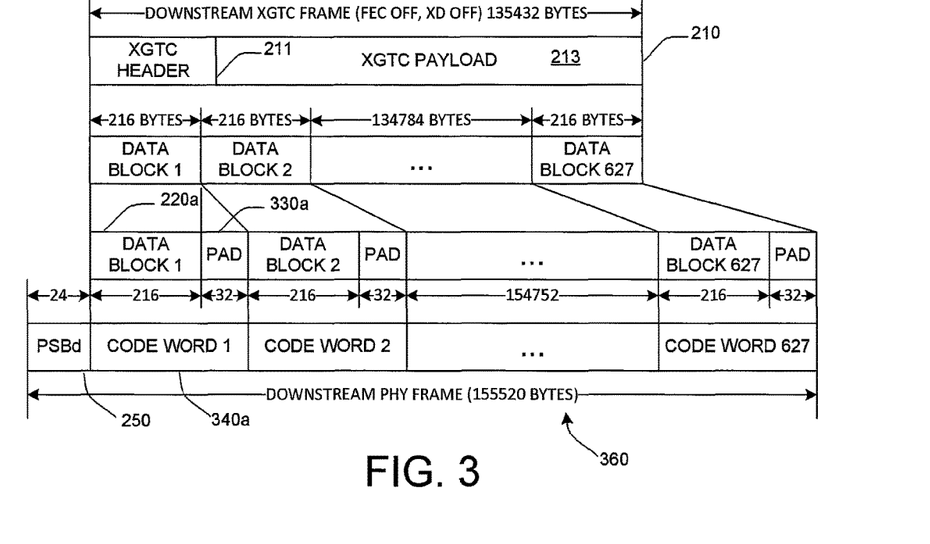
FIG. 3 is a pictorial representation illustrating an embodiment of padding byte insertion and forming in a PHY frame in XG-PON1 with FEC OFF and XD OFF.

According to embodiments of the present disclosure, a dynamic FEC ON-OFF control in XG-PON1 defines multiple alternative schemes of forming the PHY frame 260. Once the FEC encoder has been turned off, the client data path of the XGTC framing sublayer may take some finite time to execute appropriate flow control operations and catch up with the increased data rate. During this period, as shown in FIG. 3, to each data block 220, a padding block 330 is added instead of the parity block 230. The size of the padding block 330 is the same as the size of the parity block 230, i.e., 32 bytes. A PHY frame 360 is formed by prepending PSBd 250 to each series of 627 padded data blocks 340. Each padded data block 340 has a length of 248 bytes. Accordingly, the overall size of PHY frame 360 is, again, 155520 bytes.

Figure 4:
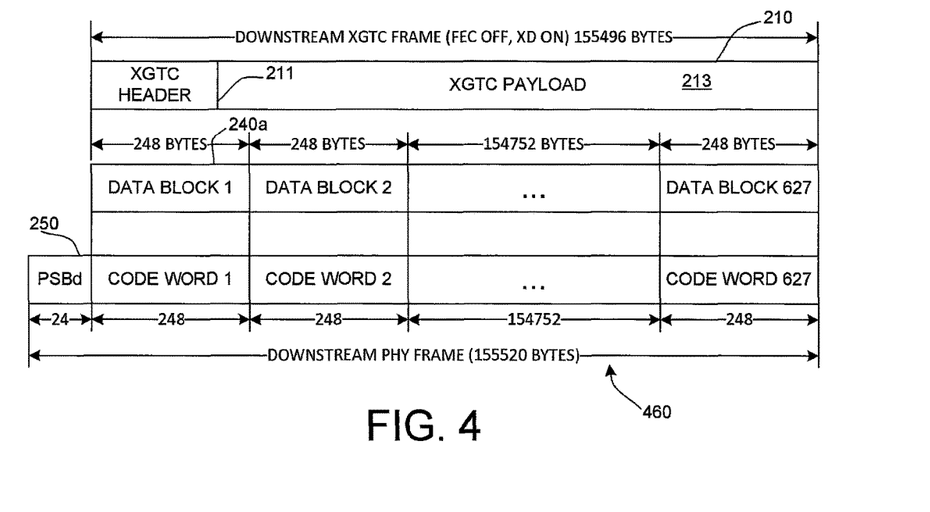

Ultimately, the XGTC framing sublayer data path catches up with the increased data rate, and the PHY frame forming becomes in accordance with FIG. 4. The XGTC frame 410 with FEC being turned off completely has the size of 155496 bytes. The PHY adaptation sublayer may partition the XGTC frame 410 into 627 data blocks 420 having size 248 bytes each, but leaves each data block intact. Again, PSBd 250 is prepended to each XGTC frame 410 to form a PHY frame 460 of 155520 bytes.

Figure 5:
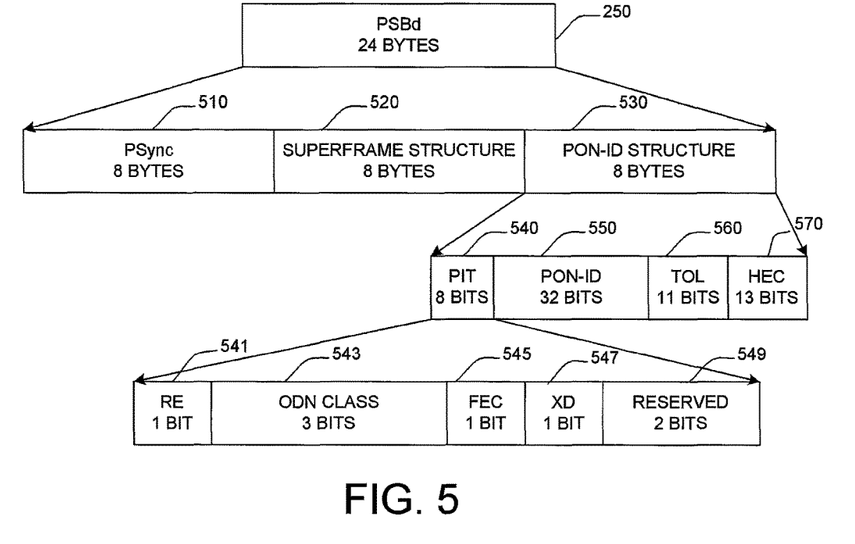
FIG. 5 is a pictorial representation of illustrating an embodiment of a PON1 PSBd structure.

To ensure that a PHY frame with dynamically changing structure is correctly parsed by the ONU, embodiments of the present disclosure introduce an FEC ON/OFF indicator bit or flag and an XD (eXtra Data) ON/OFF indicator bit or flag in PSBd 250 to indicate to the ONU FEC encoder how the PHY frame was formed. Referring to FIG. 5, PSBd 250 has the size of 24 bytes and it includes an 8-byte PSync field 510, an 8-byte SUPERFRAME STRUCTURE field 520, and an 8-byte PON-ID STRUCTURE field 530. PSync 510 field is used to delineate the PHY frames. SUPERFRAME STRUCTURE field 520, which is protected by the Hybrid Error Correction (HEC) method, carries the ordinal number of the PHY frame and is used by the ONU to synchronize to the downstream signal. PON-ID STRUCTURE field 530, which is also protected by the HEC method, carries the information that facilitates operations on the PON, including: an 8-bit PON-ID Type (PIT) field 540; a 32-bit PON-ID field 550 carrying private operations information not intended to be processed by the ONU; an 11-bit TOL field 560 carrying transmit optical level of the OLT or reach extender; and a 13-bit HEC field 570.

Under the currently in-force G.987.3 as amended by G.987.3 Amendment 1, four bits of PIT filed 540 within the PSBd structure are reserved for future use. In the embodiment of FIG. 5, two of the reserved bits are allocated to carry the FEC and XD indications to support dynamic FEC ON-OFF control on the downstream link of XG-PON1 systems and NG-PON2 TWDM-PON systems based on XG-PON1. In the embodiment of FIG. 5, an FEC bit 545 indicates whether or not the parity bytes obtained in the course of FEC parity calculation have been inserted in the code word, and an XD bit 547 indicates whether or not regular data bytes have been inserted in the code words in place of parity bytes or padding bytes. The remaining bits of PIT field 540 include one reserved bit 541, three ODN class bits 543, and two reserved bits 549.

Figure 6:
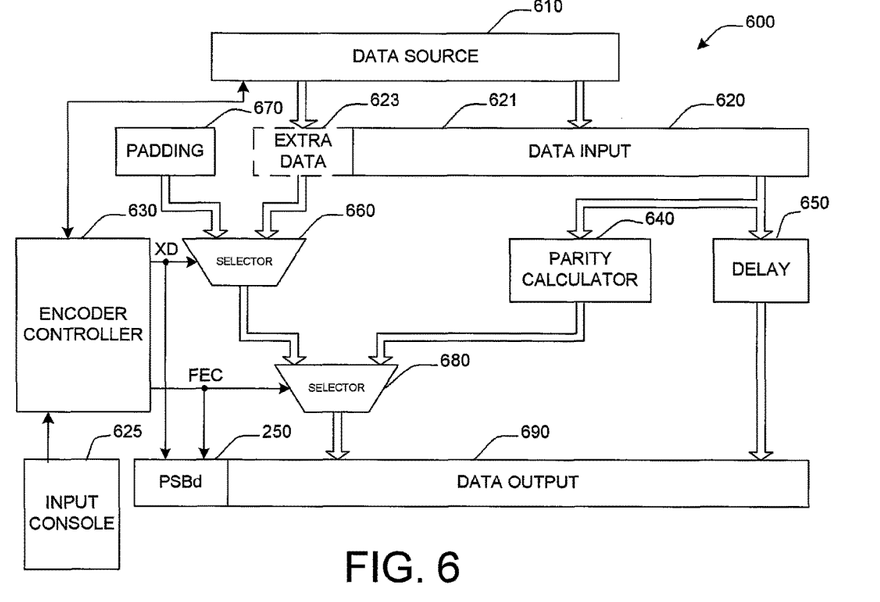
FIG. 6 is a block diagram of an XG-PON1 downstream OLT encoder with dynamic FEC ON-OFF control in accordance with one embodiment.

One embodiment of an OLT encoder apparatus 600 according to the present disclosure is shown schematically in FIG. 6. Encoder 600 works on the data block level. An encoder controller 630 controls a data source 610 (XGTC framing sublayer) to supply to a data input section 620, which provides temporary storage for data received from data source 610. Data blocks that may have the length of a code word or the length of just the data portion of the code word at variable data rate, depending on dynamic FEC and XD ON/OFF status. More particularly, in the (248,216) examples above, a data block can be a 216-byte regular data block, which held in a first part 621 of data input section 620 in the case where the FEC indicator bit or flag is ON and the XD indicator bit or flag OFF (as shown in FIG. 2) or in the case where the FEC indicator bit or flag is OFF and the XD indicator bit or flag is OFF (as shown in FIG. 3). In the case where the FEC indicator bit or flag is OFF and the XD indicator bit or flag is ON (as shown in FIG. 4), a data block can be a 248-byte expanded data block, wherein 216 bytes of the data block are held in first part 621 and a 32 bytes of extra data are held in second part 623. The ON-OFF statuses of FEC and XD are provided to an encoder controller 630 by a control console 625.

Encoder 600 simultaneously feeds data in first part 621 of data input 620 to a parity calculator 640 and a FIFO delay line 650. Encoder 600 also feeds extra data, if any, second part 623 of data input section 620 to a first selector 660. Encode 600 includes a padding block source 670, which feeds a padding block, the contents of which can be arbitrary, to first selector 660. Encoder controller 630 controls first selector 660 to supply either a padding block or extra data, if any, in second part 623 to a second selector 680, depending on XD status. If the XD indicator bit or flag is ON, controller 630 controls first selector 660 to supply extra data to FEC selector 680. If the XD indicator bit or flag is OFF, controller 630 controls first selector 660 to supply a padding block to FEC selector 680. Controller 630 also inserts the bit indicator signal XD that controls the selector 660 into PSBd 250 for transmission to the ONU.

Delay 650 feeds 216-byte data in first part 621 of data input section 620 to make up 216 bytes of a 248-byte physical layer code word, which is held in a 248-byte data out section 690. Encoder 660 feeds the parity byte output of parity calculator 640 to second selector 680. Encoder controller 630 controls second selector 680 to supply either the output of first selector 660 (padding block or extra data) or the parity block output of parity calculator 640 to make up the remaining 32 bytes of the code word held in output section 690, depending on FEC status. If the FEC indicator bit or flag is ON, controller 630 controls second selector 680 to supply parity bytes to the code word. If the FEC indicator bit or flag is OFF, controller 630 controls second selector 680 to supply either padding block 670 or extra data portion 623, depending on XD status, to the code word.

Encoder 600 concatenates sequentially encoded code words into the physical frame, which may comprise 627 code words. Controller 630 also inserts the XD and FEC indicator bits or flags that control first selector 660 and second selector 680, respectively, into a physical layer frame prefix, such as PSBd 250 for transmission to the ONU. When encoder 600 has formed and concatenated the 627 code words, PSBd 250 is prepended to the accumulated code words to form a PHY frame for transmission to ONUs 120.

Figure 7:
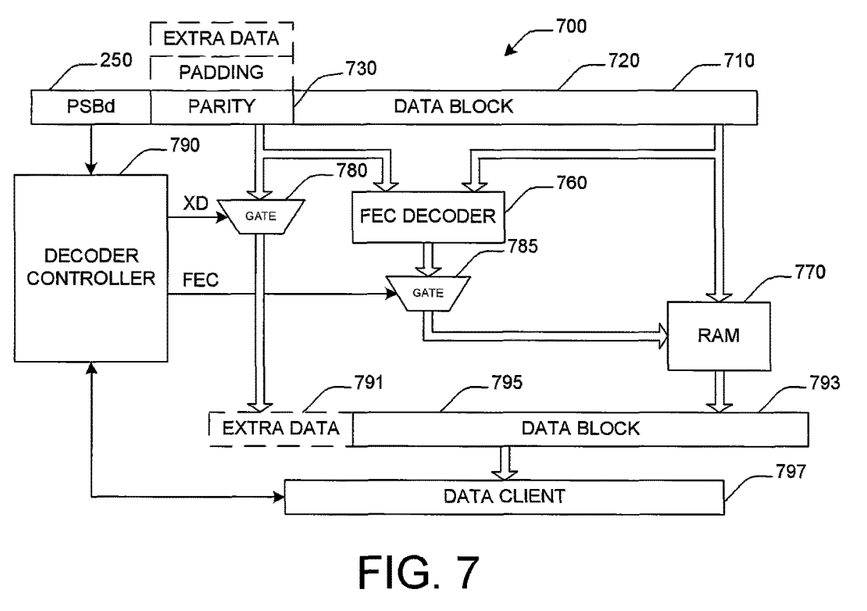
FIG. 7 is a block diagram of an XG-PON1 downstream ONU decoder with dynamic FEC ON-OFF control in accordance with one embodiment.

An embodiment of a decoder apparatus 700 according to the present disclosure is shown schematically in FIG. 7. In the embodiment of FIG. 7, decoder 700 decodes 248-byte code words received in a PHY frame. Each code word comprises a 216-byte data block, and a 32-byte second block, which can be either a parity block, a padding block or an extra data block, depending on FEC and XD ON/OFF status.

Decoder 700 receives the code word in a data input section 710, which includes a 216-byte first part 720, which holds the data block portion of the code word, and a 32-byte second part 730, which holds the second portion of the code word, which can be a parity block, a padding block, or an extra data block. Decoder 700 simultaneously feeds the contents of first part 720, which is the data block portion of the code word, to an FEC decoder 760 and a random access memory (RAM) 770. Decoder 700 also simultaneously feeds the contents of second part 730, which can be a parity block, a padding block or an extra data block to FEC decoder 760 and a first gate 780.

Figure 8:
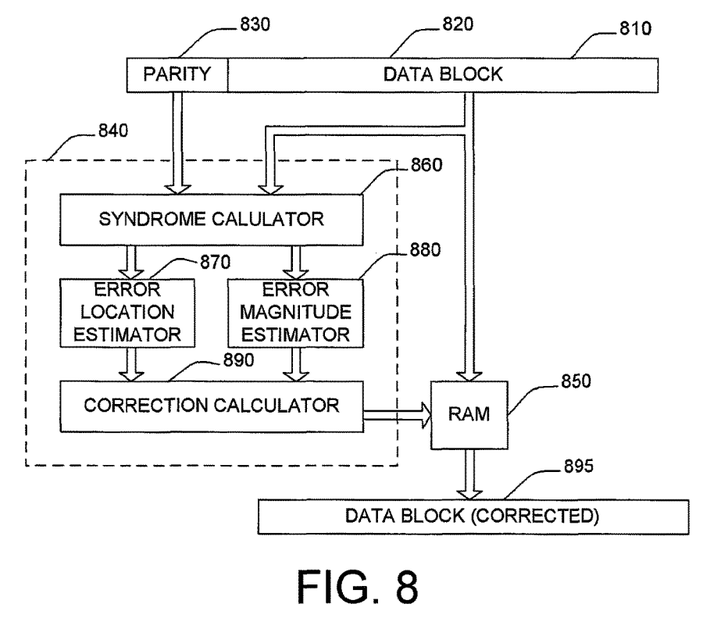
FIG. 8 is a block diagram of an embodiment of an FEC decoder.

The operation of FEC decoder 760 may be better understood with reference to FIG. 8. A received code word 810, which includes the data bytes of a data block 820 and parity bytes of a parity block 830, and which may have suffered corruption while being transmitted over the communication link, is presented to an FEC decoder 840 and simultaneously stored in a RAM 850. FEC decoder 840 includes a syndrome calculator 860 which receives data block 820 and parity block 830. The result of syndrome calculation is forwarded to an error location estimator 870, which identifies the bytes, if any, that have been corrupted, and to an error magnitude estimator 880, which evaluates a correction vector for each location. A correction calculator 890 implements a correction by executing an exclusive OR operation between the correction vector and the data byte stored for each affected location in RAM 850 to output a corrected data block 895.

Returning to FIG. 7, for each PHY frame transmitted downstream from the OLT to the ONU, PSBd 250 communicates the values of the FEC and XD bits or flags to a decoder controller 790. The decoder controller 840 further uses the XD indicator bit or flag to control first gate 780. If the XD indicator bit or flag is ON, decoder controller 790 opens first gate 780 to deliver the contents of second part 730, which is an extra data block, to an extra data part 791 of an output data section 793. If the XD indicator bit or flag is OFF, controller 790 closes first gate 780 to prevent the delivery of a parity block or a padding block held in second part 730 to output data block 793. If FEC indicator bit or flag is ON, decoder controller 790 opens second gate 785 to deliver the output of FEC decoder 760 to RAM 770. If FEC indicator bit or flag is OFF, decoder controller 790 closes second gate 785 to prevent delivery of the output of FEC decoder to RAM 770. RAM 770, depending on the status of the FEC indicator bit or flag, outputs either the corrected or uncorrected 216-byte data block to a data block part 795 of output data section 793. Decoder 700 delivers the contents of output data section 793, which may be a 216-byte corrected data block or 216-byte uncorrected data block and a 32-byte extra data block to client data 797.

To summarize the operation of decoder 700, if the FEC indicator bit or flag is ON and the XD indicator bit or flag is OFF, decoder 700 outputs a corrected 216-byte data to client data 797. If the FEC indicator bit or flag is OFF and the XD indicator bit or flag is OFF, decoder 700 outputs an uncorrected 216-byte data block to client data 797. If the FEC indicator bit or flag is OFF and the XD indicator bit or flag is ON, decoder 700 outputs a 248-byte data block, including an uncorrected data block and an extra data block, to client data 797.

Figure 9A:
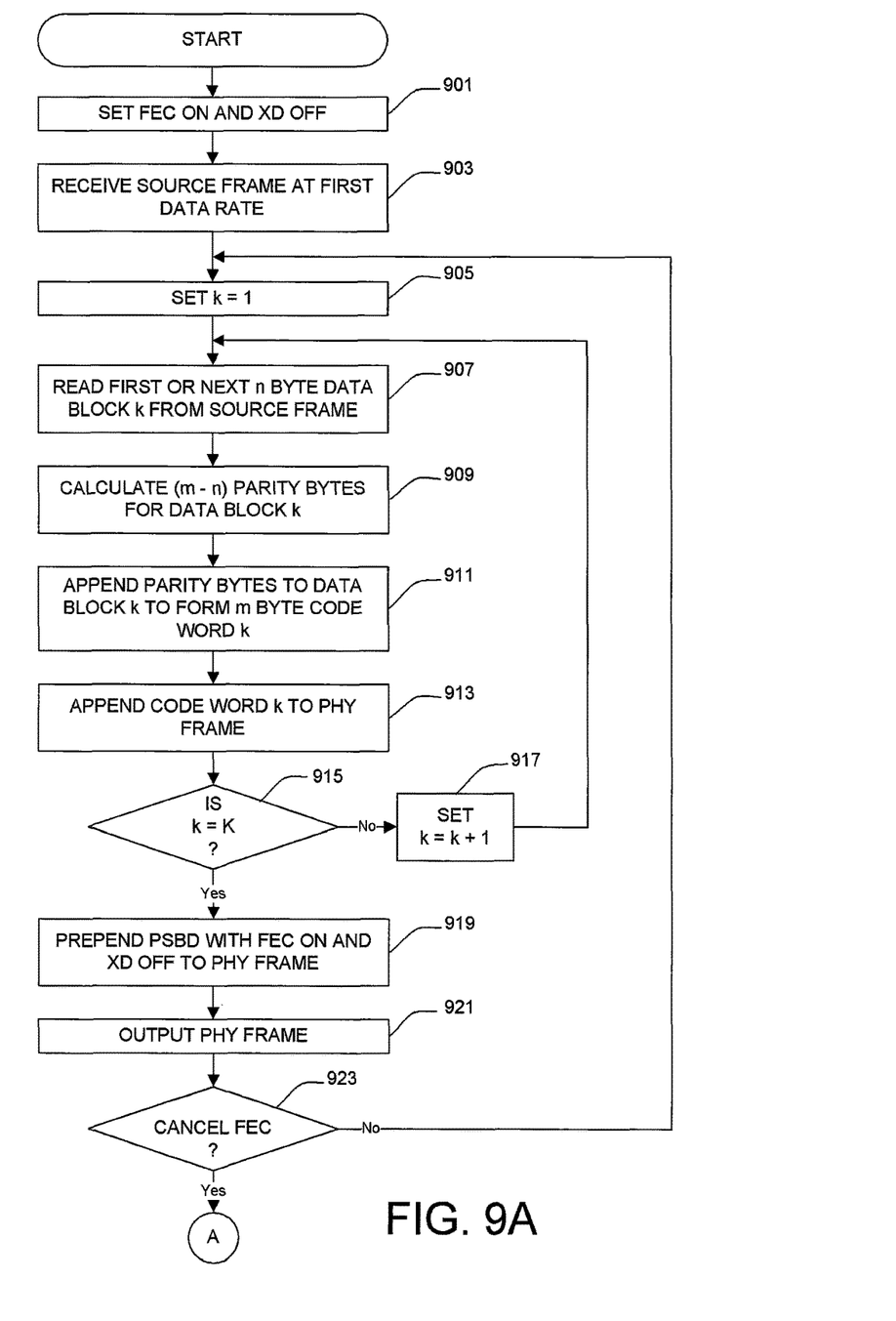
FIGS. 9A-9C illustrate flow charts for performing dynamic FEC ON-OFF encoding, in accordance with exemplary embodiments of the invention.
Figure 9B:
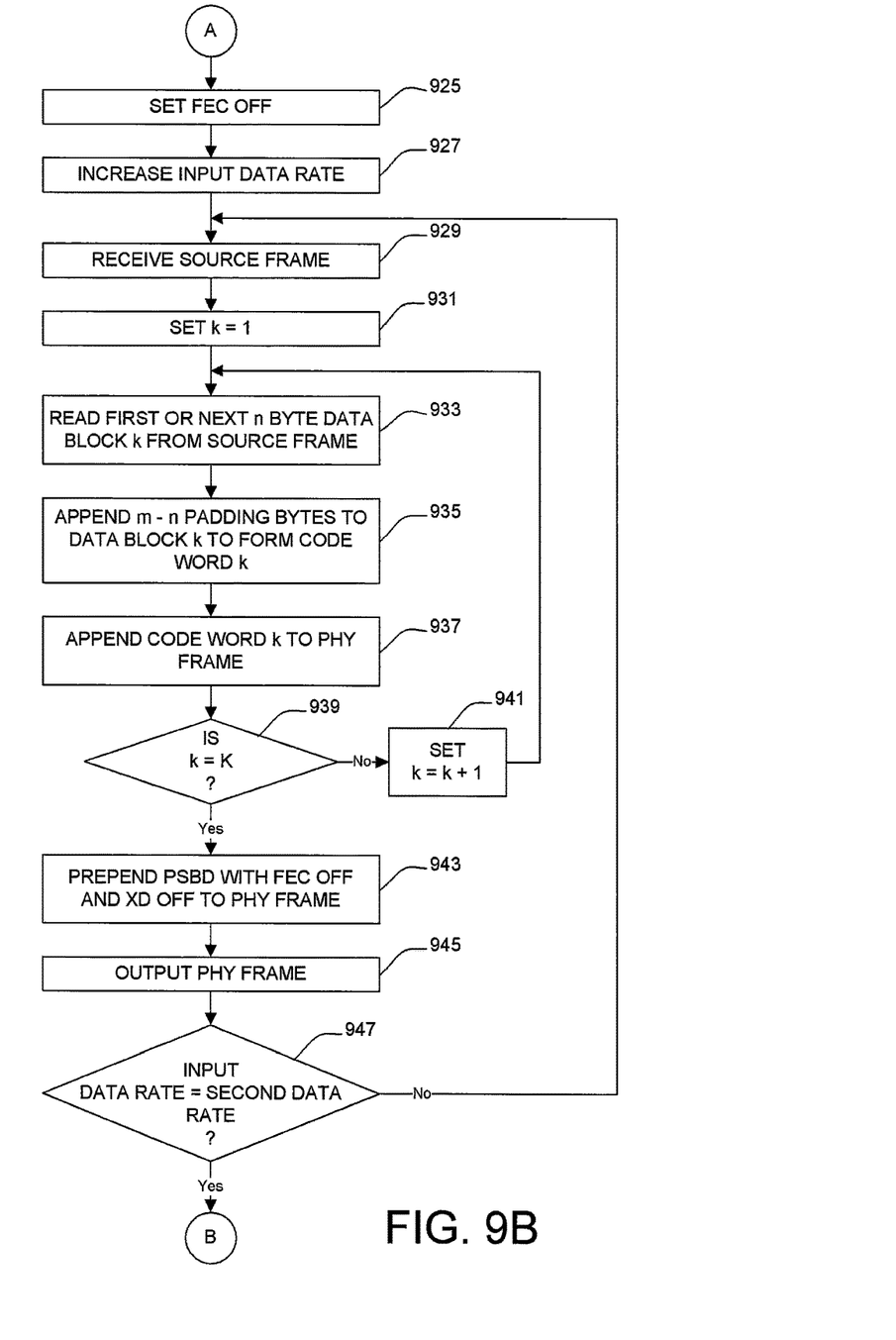
Figure 9C:
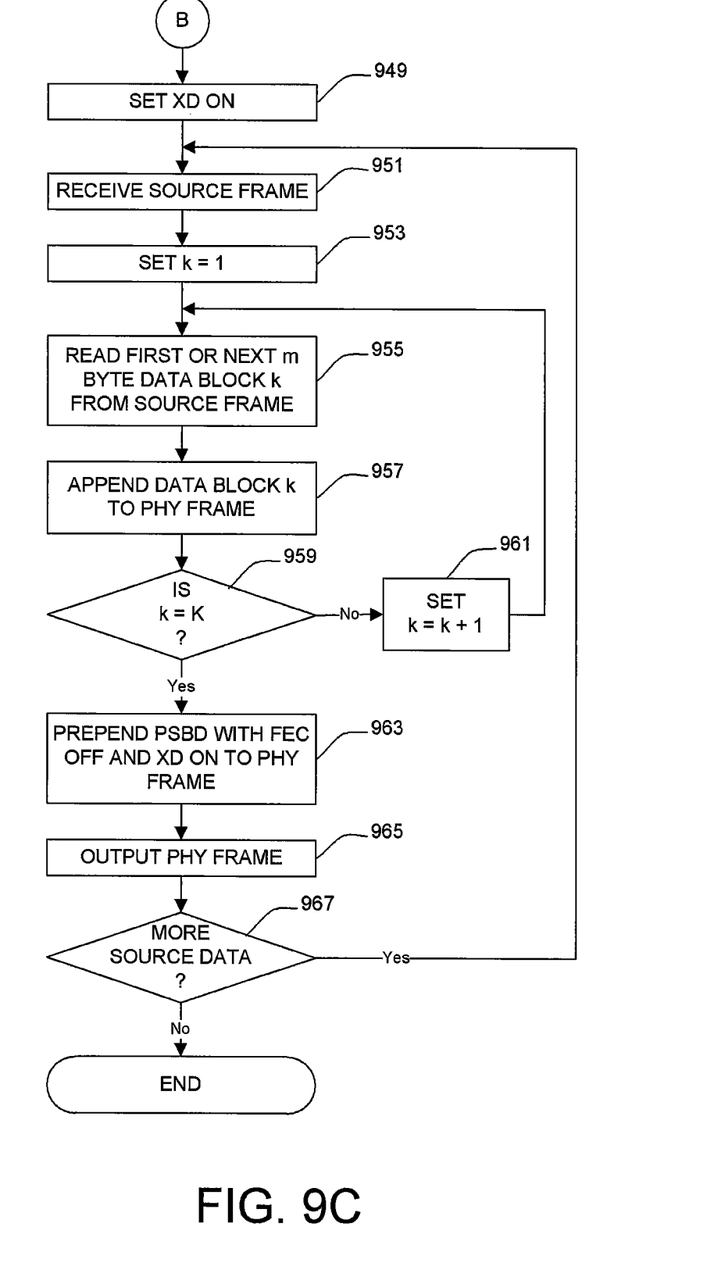

FIGS. 9A-9C comprise a flowchart of an embodiment of transmitter processing according to the present disclosure. Referring first to FIG. 9A, initially the FEC indicator bit or flag is set to ON and the XD indicator bit or flag is set to OFF, as indicated at block 901. The transmitter receives a source frame at a first data rate, which may be, for example, 135432 bytes per frame every 125 microseconds (8.667648 Gbps), as indicated at block 903. Then the transmitter sets a constant k equal to 1, at block 905. The transmitter then reads the first or next n-byte data block k from the source frame, at block 907. For the sake of generally the flowchart of FIGS. 9A-9C use the (m,n) notation which may represent (248,216) discussed above. Accordingly n may be 216. The transmitter calculates (m-n) (for example 248−216=32) parity bytes for data block k, at block 909, and appends the (m-n) parity bytes to data block k, at block 911, to form an m-byte code word, where m may be, for example, 248. Then, the transmitter appends code word k to a PHY frame, at block 913, and determines, at decision block 915, if k is equal to K, which may be, for example, 627. If k is not equal to K, the transmitter sets k=k+1, at block 917, and processing returns to block 907. If k is equal to K, which indicates that the PHY frame is complete, the transmitter prepends the PSBd with FEC set to ON and XD set to OFF, at block 919, and outputs the PHY frame, at block 921. Then, the transmitter determines, at decision block 923, if FEC has been canceled. If FEC has not been canceled, processing returns to block 905. If FEC has been canceled, processing proceeds to FIG. 9B.

Referring now to FIG. 9B, the transmitter sets FEC to OFF, at block 925, and increases the input data rate, at block 927. Then the transmitter receives a source data frame, at block 929, and sets constant k equal to 1, at block 931. The transmitter reads the first or next n-byte data block k from the source data frame, at block 933, and appends (m-n) padding bytes to data block k to form a code word k, at block 935. Then the transmitter appends code work k to a PHY frame, at block 937, and determines, at decision block 939, if k is equal to K. If k is not equal to K, the transmitter sets k=k+1, at block 941, and processing returns to block 933. If k is equal to K, the transmitter prepends the PSBd with FEC set to OFF and XD set to OFF, at block 943, and outputs the PHY frame, at block 945. Then, the transmitter determines, at decision block 947, if the input data rate is equal to a second data rate. The second data rate may be, for example, 155496 bytes per frame every 125 microseconds (9.951744 Gbps) If the input data rate is not equal to the second data rate, processing returns to block 929. If the input data rate is equal to the second data rate, processing proceeds to FIG. 9C.

Referring now to FIG. 9C, the transmitter sets XD to ON, at block 949. Then the transmitter receives a source data frame, at block 951, and sets constant k equal to 1, at block 953. The transmitter reads the first or next m-byte data block k from the source data frame, at block 955, where m may be, for example, 248. Then, the transmitter appends data block k to a PHY frame, at block 957, and determines, at decision block 959, if k is equal to K. If k is not equal to K, the transmitter sets k=k+1, at block 961, and processing returns to block 953. If k is equal to K, the transmitter prepends the PSBd with FEC set to OFF and XD set to ON, at block 963, and outputs the PHY frame, at block 955. Then, the transmitter determines, at decision block 967, if there is more source data. If there is more source data, processing returns to 951. If there is no more source data, processing ends. Thus, processing according to FIGS. 9A-9C enables the transmitter to transition dynamically from an FEC processing mode, with an input data rate of, for example, 8.667648 Gbps, to an input data rate of, for example, 9.951744 Gbps, while maintaining an output data rate of, for example, 9.95328 Gbps, thereby increasing the effective capacity of the downstream link from about 87.1% to almost 100%, without loss of data.

Figure 10A:
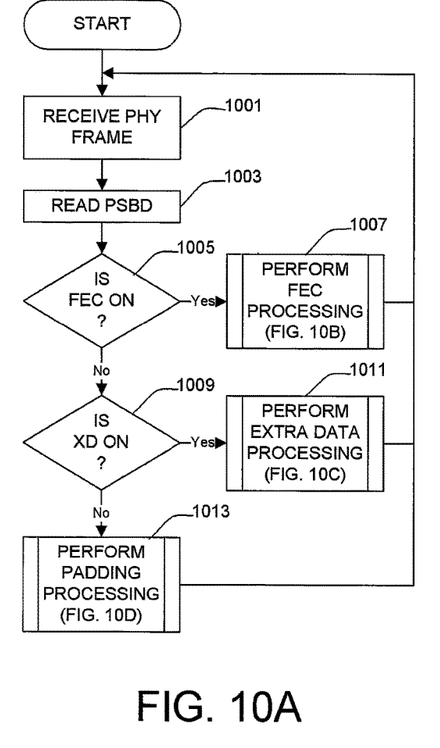
FIGS. 10A-10D illustrate flow charts for performing dynamic FEC ON-OFF decoding, in accordance with exemplary embodiments of the invention.

FIGS. 10A-10D comprise a flowchart of an embodiment of receiver processing according to the present disclosure. Referring first to FIG. 10A, the receiver receives a PHY frame, block 1001. The receiver reads the PBSd, at block 1003, to determine the FEC and XD ON/OFF status. If the FEC indicator bit or flag is ON, as determined at decision block 1005, the receiver performs FEC processing on the PHY frame, as indicated generally at block 1007 and shown in detail in FIG. 10B, and returns to block 1001. If the FEC indicator bit or flag is not on, the receiver determines at decision block 1009, if the XD indicator bit or flag is ON. If the XD indicator bit or flag is ON, the receiver performs extra data processing, as indicated generally at block 1011 and shown in detail in FIG. 10B, and returns to block 1001. If the XD indicator bit or flag is not on, the receiver performs padding processing, as indicated generally at block 1013 and shown in detail in FIG. 10D, and returns to block 1001.

Figure 10B:
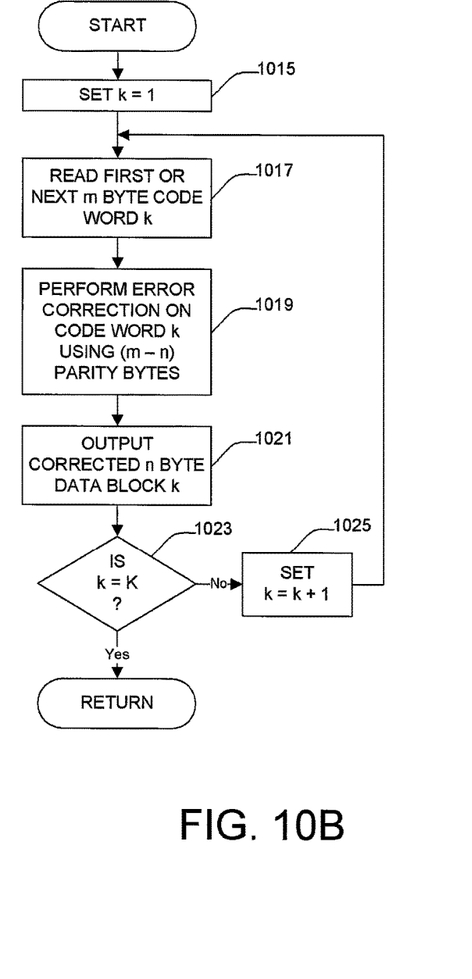

Referring now to FIG. 10B, there is shown a flowchart of an embodiment of receiver FEC processing according to the present disclosure. The receiver sets k equal to 1, at block 1015. The receiver reads the first or next m-byte code word k from the PHY frame, as indicated at block 1017, wherein m may be, for example, 248. Then, the receiver performs error correction on code word k using m-n parity bytes from code word k, at block 1019, wherein n may be, for example, 216. Then, the receiver outputs a corrected n-byte data block, at block 1021, and determines, at decision block 1023, if k is equal to K, which is the number of code words in the PHY frame. If k is not equal to K, the receiver sets k equal to k plus 1, at block 1025, and processing returns to block 1017. If k is equal to K, processing returns to block 1001 of FIG. 10A to receive another PHY frame.

Figure 10C:
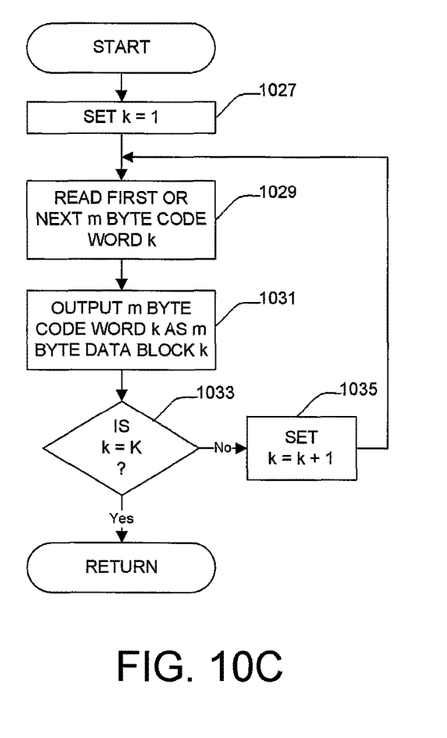

Referring now to FIG. 10C, there is shown a flowchart of an embodiment of receiver extra data processing according to the present disclosure. The receiver sets k equal to 1, at block 1027, and reads the first or next m-byte code word k from the PHY frame, as indicated at block 1029. Then, the receiver outputs the m-byte code word k as m-byte data block k, at block 1031, and determines, at decision block 1033, if k is equal to K. If k is not equal to K, the receiver sets k equal to k plus 1, at block 1035, and processing returns to block 1027. If k is equal to K, processing returns to block 1001 of FIG. 10A to receive another PHY frame.

Figure 10D:
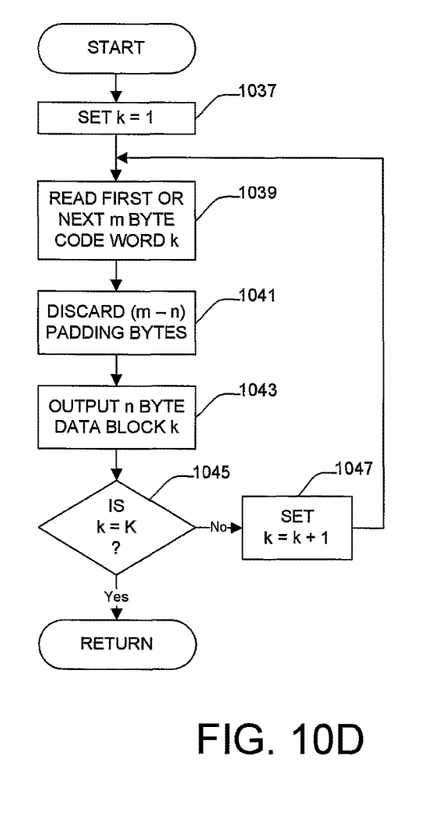

Referring now to FIG. 10D, there is shown a flowchart of an embodiment of receiver padding processing according to the present disclosure. The receiver sets k equal to 1, at block 1037, and reads the first or next m-byte code word k from the PHY frame, as indicated at block 1039. Then, the receiver discards the m-n padding bytes from code word k, at block 1041, and outputs the remaining n-byte data block k, at block 1043. The receiver then determines, at decision block 1045, if k is equal to K. If k is not equal to K, the receiver sets k equal to k plus 1, at block 1047, and processing returns to block 1037. If k is equal to K, processing returns to block 1001 of FIG. 10A to receive another PHY frame.

While various embodiments of the invention have been described above, it should be understood that they have been presented by way of example only, and not of limitation. Likewise, the various diagrams may depict an example architectural or other configuration for the invention, which is done to aid in understanding the features and functionality that can be included in the invention. The present invention is not restricted to the illustrated example architectures or configurations, but can be implemented using a variety of alternative architectures and configurations. Additionally, although the invention is described above in terms of various exemplary embodiments and implementations, it should be understood that the various features and functionality described in one or more of the individual embodiments are not limited in their applicability to the particular embodiment with which they are described, but instead can be applied, alone or in some combination, to one or more of the other embodiments of the invention, whether or not such embodiments are described and whether or not such features are presented as being a part of a described embodiment. Thus the breadth and scope of the present invention should not be limited by any of the above-described exemplary embodiments.

One or more of the functions described in this document may be performed by an appropriately configured module. The term "module" as used herein, refers to software that is executed by one or more processors, firmware, hardware, and any combination of these elements for performing the associated functions described herein. Additionally, for purpose of discussion, the various modules are described as discrete modules; however, as would be apparent to one of ordinary skill in the art, two or more modules may be combined to form a single module that performs the associated functions according embodiments of the invention.

Additionally, one or more of the functions described in this document may be performed by means of computer program code that is stored in a "computer program product", "computer-readable medium", and the like, which is used herein to generally refer to media such as, memory storage devices, or storage unit. These, and other forms of computer-readable media, may be involved in storing one or more instructions for use by processor to cause the processor to perform specified operations. Such instructions, generally referred to as "computer program code" (which may be grouped in the form of computer programs or other groupings), which when executed, enable the computing system to perform the desired operations.

It will be appreciated that, for clarity purposes, the above description has described embodiments of the invention with reference to different functional units and processors. However, it will be apparent that any suitable distribution of functionality between different functional units, processors or domains may be used without detracting from the invention. For example, functionality illustrated to be performed by separate units, processors or controllers may be performed by the same unit, processor or controller. Hence, references to specific functional units are only to be seen as references to suitable means for providing the described functionality, rather than indicative of a strict logical or physical structure or organization.

What is claimed is:

1. A method of transmitting data performed by a data communication node, the method comprising:
controlling data source output source frames at a first data rate;
receiving a source frame at an encoder at the first data rate;
reading a fixed number of n-byte data blocks from the source frame, wherein n is an integer;
appending an (m-n)-byte parity block to each n-byte data block to form a fixed number of m-byte first code words, wherein m is an integer greater than n;
prepending to the fixed number of m-byte first code words a first prefix to form an error correcting physical frame, the first prefix including an error correction indicator set to a first value and an extra data indicator set to a second value;
transmitting the error correcting physical frame at a fixed transmit data rate;
controlling the data source to increase an output data rate of the source frames;
receiving a source frame at the encoder at the increased data rate;
reading the fixed number of n-byte data blocks from the source frame received at the increased data rate;
appending an (m-n)-byte padding block to each n-byte data block from the source frame received at the increased data rate to form a fixed number of m-byte second code words;
prepending to the fixed number of m-byte second code words a second prefix to form a padded physical frame, the second prefix including the error correction indicator set to the second value and the extra data indicator set to the second value;
transmitting the padded physical frame at the fixed transmit data rate;
controlling a first hardware selector to output to a second hardware selector extra data blocks, if the extra data indicator is set to the first value, and padding blocks, if the extra data indicator is set to the second value; and
controlling the second hardware selector to output to a code word section parity blocks from a parity calculator, if the error correction indicator is set to the first value, and the output of the first hardware selector, if the error correction indicator is set to the second value.

2. The method as claimed in claim 1, further comprising:
detecting when the output data rate of the source frames is equal to a second data rate, the second data rate being higher than the first data rate;
receiving a source frame at the encoder at the second data rate;
reading the fixed number of m-byte data blocks from the source frame received at the second data rate;
prepending to the fixed number of m-byte data blocks from the source frame received at the second data rate a third prefix to form an extra data physical frame, the third prefix including the error correction indicator set to the second value and the extra data indicator set to the first value; and
transmitting the extra data physical frame at the fixed transmit data rate.

3. The method as claimed in claim 1, wherein the first value is on and the second value is off.

4. The method as claimed in claim 1, wherein:
the error correction indicator comprises a first bit of the prefix; and,
the extra data indicator comprises a second bit of the prefix.

5. A method of receiving data performed by a data communication node, the method comprising:
receiving a physical frame at a decoder, the physical frame including a fixed number of m-byte code words and a prefix, the prefix including an error correction indicator and an extra data indicator, wherein m is an integer;
if the error correction indicator is set to a first value and the extra data indicator is set to a second value, operating the decoder to close a first gate and open a second gate to perform error correction on each code word of the physical frame to output n-byte data blocks, wherein n is an integer less than m;
if the error correction indicator is set to the second value and the extra data indicator is set to the second value, operating the decoder to close the first gate and close the second gate to discard an (m-n)-byte padding block from each code word of the physical frame to output n-byte data blocks; and,
if the error correction indicator is set to the second value and the extra data indicator is set to the first value, operating the decoder to open the first gate and close the second gate to output each code word of the physical frame as an m-byte data block.

6. The method as claimed in claim 5, wherein the first value is on and the second value is off.

7. The method as claimed in claim 5, wherein:
the error correction indicator comprises a first bit of the prefix; and,
the extra data indicator comprises a second bit of the prefix.

8. The method as claimed in claim 5, wherein each m-byte code word comprises an n-byte data block and an (m-n)-byte second block.

9. The method as claimed in claim 8, wherein:
if the error correction indicator is set to the first value and the extra data indicator is set to the second value, the second block comprises a parity block;
if the error correction indicator is set to the second value and the extra data indicator is set to the second value, the second block comprises a padding block;
if the error correction indicator is set to the second value and the extra data indicator is set to the first value, the second block comprises an extra data block.

10. A transmitter, which comprises:
a data source; and
an encoder including:
an m-byte input data section, the input data section including an n-byte first part coupled to receive n-byte data blocks from the data source and an (m-n)-byte second part coupled to receive (m-n)-byte extra data blocks from the data source;

a parity calculator coupled to receive n-byte data blocks from the first part of the input data section and calculate (m-n)-byte parity blocks;
a delay section coupled to receive the n-byte data blocks from the first part of the input data section;
a padding byte source;
a first hardware selector coupled receive padding bytes from the padding byte source and extra data blocks from the second part of the input data section, the first hardware selector operable to selectively output padding bytes or extra data blocks;
a second hardware selector coupled to the first hardware selector and the parity calculator, the second hardware selector operable to selectively output the output of the first hardware selector or parity blocks;
a code word section coupled to the second hardware selector and the delay section; and
an encoder controller operable to:
control the data source to supply to the encoder n-byte data blocks, if an extra data indicator is set to a first value, and m-byte data blocks, if the extra data indicator is set to a second value;
control the first hardware selector to output to the second hardware selector extra data blocks, if the extra data indicator is set to the first value, and padding blocks, if the extra data indicator is set to the second value; and,
control the second hardware selector to output to the code word section parity blocks from the parity calculator, if an error correction indicator is set to the first value, and the output of the first hardware selector, if the error correction indicator is set to the second value.

11. The transmitter as claimed in claim 10, wherein the encoder controller is operable to insert error correction indicator and extra data settings in a preamble of a physical layer frame comprising a plurality of concatenated code words.

12. The transmitter as claimed in claim 10, wherein the encoder controller is operable to maintain an input data rate from the data source to the encoder at a first rate when the error correction indicator is set the first value and the extra data indicator is set to the second value.

13. The transmitter as claimed in claim 12, wherein the encoder controller is operable to maintain the input data rate at a second rate when the error correction indicator is set the second value and the extra data indicator is set to the first value, wherein the second rate is greater than the first rate.

14. The transmitter as claimed in claim 13, wherein the encoder controller is operable to increase the input data rate from the first rate to the second rate when the error correction indicator is set to the second value and the extra data indicator is set to the second value.

15. A receiver, which comprises:
a physical frame source coupled to receive fixed size physical frames, each physical frame including a prefix and a plurality of m-byte code words, each prefix including an extra data indicator and an error correction indicator;
a decoder coupled to receive physical frames from the physical frame source, the decoder including:
an input data section coupled to sequentially receive m-byte code words from the physical frame source, the input data section including a first part receiving n-byte data blocks and a second part receiving (m-n)-byte second blocks;
a first gate coupled to receive second blocks from the second part of the input data section;
an error correction decoder coupled to receive second blocks from the second part of the input data section and data blocks from the first part of the input data section;
a second gate coupled to receive coupled to receive output from the error correction decoder:
a random access memory (RAM) coupled to receive data blocks from the first part of the input data section and output from the second gate;
an m-byte output data section coupled to receive n-byte data blocks from the RAM and to receive (m-n)-byte extra data from the first gate; and
a decoder controller operable to:
read the prefix of a physical frame received from the physical frame source to determine setting for the extra data indicator and the error correction indicator;
open the first gate if the extra data indicator is set to a first value and close the first gate if the extra data indicator is set to a second value; and
open the second gate if the error correction indicator is set to the first value and close the second gate if the error correction indicator is set the second value.

16. The receiver as claimed in claim 15, wherein the first value is on and the second value is off.

17. The receiver as claimed in claim 15, wherein:
the error correction indicator comprises a first bit of the prefix; and
the extra data indicator comprises a second bit of the prefix.

18. The receiver as claimed in claim 15, wherein the decoder receives the physical frames at a fixed data rate.

19. The receiver as claimed in claim 15, wherein m is 248 and n is 216.

* * * * *